(12) United States Patent
Fujihara et al.

(10) Patent No.: US 7,315,421 B2
(45) Date of Patent: Jan. 1, 2008

(54) METHOD OF LASER MARKING, LASER MARKING APPARATUS AND METHOD AND APPARATUS FOR DETECTING A MARK

(75) Inventors: Atsushi Fujihara, Kanagawa-ken (JP); Michio Nakayama, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 10 days.

(21) Appl. No.: 11/086,209

(22) Filed: Mar. 23, 2005

(65) Prior Publication Data
US 2005/0233550 A1    Oct. 20, 2005

(30) Foreign Application Priority Data
Mar. 26, 2004    (JP)    ............... 2004-093414

(51) Int. Cl.
*G02B 27/10*    (2006.01)
*G02B 27/14*    (2006.01)

(52) U.S. Cl. ............... 359/619; 359/618; 359/626; 359/629

(58) Field of Classification Search ............... 359/618, 359/619, 626, 629, 534
See application file for complete search history.

(56) References Cited

U.S. PATENT DOCUMENTS

| | | | | |
|---|---|---|---|---|
| 4,999,487 | A * | 3/1991 | Maruyama et al. | 250/216 |
| 5,568,259 | A * | 10/1996 | Kamegawa | 356/625 |
| 2002/0040892 | A1* | 4/2002 | Koyama et al. | 219/121.69 |
| 2005/0270650 | A1* | 12/2005 | Tsukihara et al. | 359/618 |

FOREIGN PATENT DOCUMENTS

| | | |
|---|---|---|
| JP | 11-033752 | 2/1999 |
| JP | 11-260675 | 9/1999 |

* cited by examiner

*Primary Examiner*—Timothy Thompson
*Assistant Examiner*—Brandi Thomas
(74) *Attorney, Agent, or Firm*—Finnegan, Henderson, Farabow, Garrett & Dunner, L.L.P.

(57) ABSTRACT

A method and apparatus for laser marking is disclosed. An interference fringe is formed on a subject to be marked using a laser beam to make a marking.

3 Claims, 5 Drawing Sheets

METHOD OF LASER MARKING, LASER MARKING APPARATUS AND METHOD AND APPARATUS FOR DETECTING A MARK

CROSS REFERENCE TO RELATED APPLICATION

This application is based upon and claims the benefit of priority from prior Japanese Patent Application No. 2004-93414 filed on Mar. 26, 2004, the entire contents of which are incorporated herein by reference.

BACKGROUND

1. Technical Field

The present invention relates to a method and an apparatus for laser marking, and a method and apparatus for detecting a mark, in particular, to a method and an apparatus of laser marking a subject, such as a semiconductor wafer, and a method and apparatus for detecting a mark formed on a subject, such as a semiconductor wafer.

2. Description of the Related Art

Japanese Patent Disclosure (Kokai) No. 11-33752 shows a laser marking method to make a marking of good visibility on an optical material, such as a glass for a liquid crystal display, without cracking the optical material.

A laser marker shown in this disclosure has a laser apparatus emitting a pulse laser beam having 30 through 100 μm width. A polygon mirror swings the pulse laser beam so as to ablate a surface of the optical material. Thus, a concave portion visually recognized as a marking is formed on the optical material.

Japanese Patent Disclosure (Kokai) No. 11-260675 shows another conventional laser marking method to make a dot marking on a semiconductor wafer. The method prevents the adhesion of melted splashing particles on a semiconductor wafer caused during laser marking and ensures visibility by keeping stable all the time the shapes of the dot marks, even after being subjected to a number of treatments during a number of steps in a semiconductor device manufacturing process.

In this method, a transparent thin film is formed at least in a dot mark forming region of a surface of a semiconductor wafer. The dot mark forming region is irradiated with a laser beam having a wavelength through the transparent thin film. The laser beam transmitted through the transparent thin film melts and deforms the dot mark forming region to form dot marks. At the same time, the heat which is generated when the mark forming region is melted is used to change the transparent thin film into the same shape as the dot marks without causing the destruction of the transparent thin film. The thin film protects the dot marks from the adhesion of melted splashing particles and ensures the visibility of the dot marks.

FIG. 5 shows another conventional marking apparatus to make a marking on a subject such as a semiconductor wafer using a laser beam having a Gaussian intensity distribution. A laser light source 1 emits a laser beam toward a galvano-mirror 2 which serves as an incident pupil. Galvano-mirror 2 includes a moveable coil (not shown) placed in a magnetic field. Flowing current generates an electromagnetic force according to an amount of the current, and rotates the moveable coil with a small reflective mirror attached to the axis thereof. The angle of the reflective mirror is adjustable by controlling the amount of the current. A laser beam reflected off galvano-mirror 2, is focused on a back surface of semiconductor wafer 4 using focus lens 3 (f-θ lens) so that dot marks are made. Depths of the dot marks are very deep, i.e., around 5 μm, so these dot marks are called hard marks. Even though an intensity of the laser beam is trying to be kept as minimum as possible so as not to damage the dot marks and make the dot marks connect to each other, semiconductor wafer 4 sometimes cracks or weakens owing to the laser beam. Moreover, making hard marks needs such a high intensity of a laser beam that semiconductor wafer 4 cannot help ablating, which contaminates an area around the hard marks, and/or deteriorates the flatness of the semiconductor wafer, which has a negative influence on the process of forming a transistor, in particular on lithography processes, on semiconductor wafer 4.

In order to avoid these problems, a soft marking method which uses a laser beam having a lower intensity is also known. However, the soft marking method forms a fusion mark of submicron scale, which deteriorates visibility of a soft mark.

It is desirable to provide a laser marking apparatus and method which makes a shallow marking with a good visibility because fine lithography in a semiconductor manufacturing process needs a flat wafer.

SUMMARY

Consistent with the present invention, there is a method of laser marking. The method includes forming an interference fringe on a subject to be marked and using a laser beam to make a marking.

In another aspect consistent with the present invention, there is a laser marking apparatus. The laser marking apparatus includes a laser light source to emit a laser beam and an optical element to form an interference fringe using the laser beam on a subject to be marked.

In another aspect consistent with the present invention, there is a method of detecting a mark. The method includes irradiating a mark formed by an interference fringe and detecting scattered light from the mark.

DESCRIPTION

Figure 1:
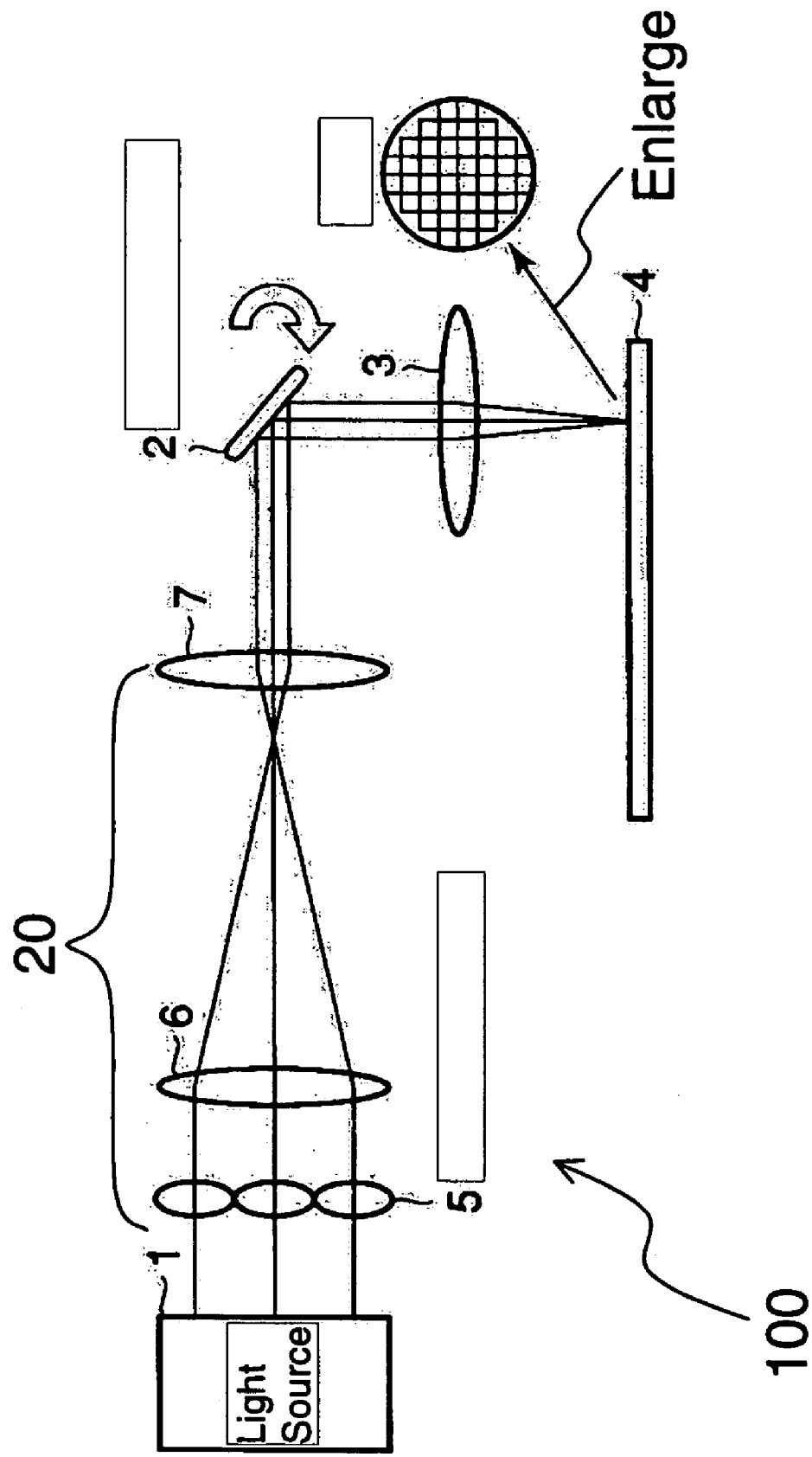
FIG. 1 is a schematic diagram of an exemplary laser marking apparatus consistent with the invention.

Exemplary embodiments consistent with the present invention are explained next with respect to FIGS. 1 to 3. As shown in FIG. 1, a laser marking apparatus 100 has an intensity distributor 20 (including at least one optical element) to form an interference fringe. Intensity distributor 20 is arranged between a laser light source 1 and a galvano-mirror 2, which serves as an incident pupil. In the embodiment shown, intensity distributor 20 comprises a fly-eye lens 5 to divide a laser beam into plural laser fluxes, an imaging lens 6 and a focus lens 7. Imaging lens 6 and focus lens 7 superpose and focus the divided laser fluxes to form an interference fringe on a surface of a semiconductor wafer 4.

Figure 2:
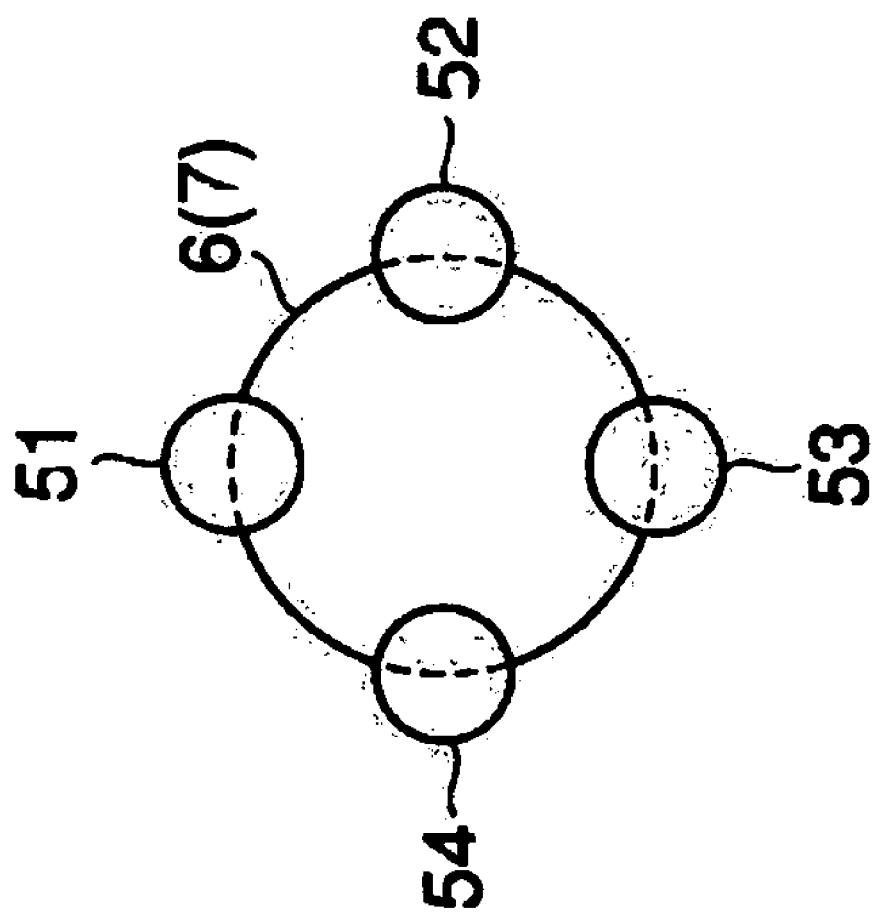
FIG. 2 is a schematic structure of a fly-eye lens viewed from an optical axis.

In the embodiment shown in FIG. 2, fly-eye lens 5 comprises of four convex lenses 51, 52, 53 and 54 arranged at equal spacing on a concentric circumference.

In One embodiment, galvano-mirror 2, which is used to reflect the laser fluxes is a mechanical scanner. Mechanical scanner is a generic term for a scanner to deflect and scan a laser beam by oscillating and banking mirror installed therein. Galvano-mirror 2 includes a moveable coil (not shown) placed in a magnetic field. Flowing current generates an electromagnetic force (torque) according to the amount of the current, and rotates the moveable coil with a small reflective mirror (not shown) attached to the axis thereof. The angle of the reflective mirror is adjustable by controlling the amount of the current.

A f-θ lens 3 is arranged along an optical path between galvano-mirror 2 and semiconductor wafer 4 to focus the laser fluxes on the surface of semiconductor wafer 4.

An operation of laser marking apparatus 100 is explained next. In the embodiment shown, a laser beam emitted from laser light source 1 is divided into four laser fluxes by fly-eye lens 5. Then, the divided laser fluxes pass through imaging lens 6, focus lens 7 and f-θ lens 3 via galvano-mirror 2 to form an interference fringe (Moire fringe) on a surface of semiconductor wafer 4. That is, a multiple beam interference is created. In other words, an intensity distribution is produced on purpose using intensity distributor 20 without using a laser beam having an excessive intensity, so that a mark with good visibility can be made without adhesion of melted splashing particles or deterioration of the flatness of semiconductor wafer 4.

In this embodiment, an interference fringe is an optical phenomena where electromagnetic waves having the same phase are mutually amplified while electromagnetic waves that are out of phase are mutually weakened.

In this embodiment, a multiple beam interference is an interference generated by dividing a light beam emitted from a light source into more than one light fluxes, and superposing the light fluxes which pass through optical paths that are different from each other.

In one embodiment, the multiple beam interference generates a sinusoidal-wave-like intensity distribution. In one embodiment, one of laser fluxes may have a different intensity from those of the other laser fluxes.

Figure 3:
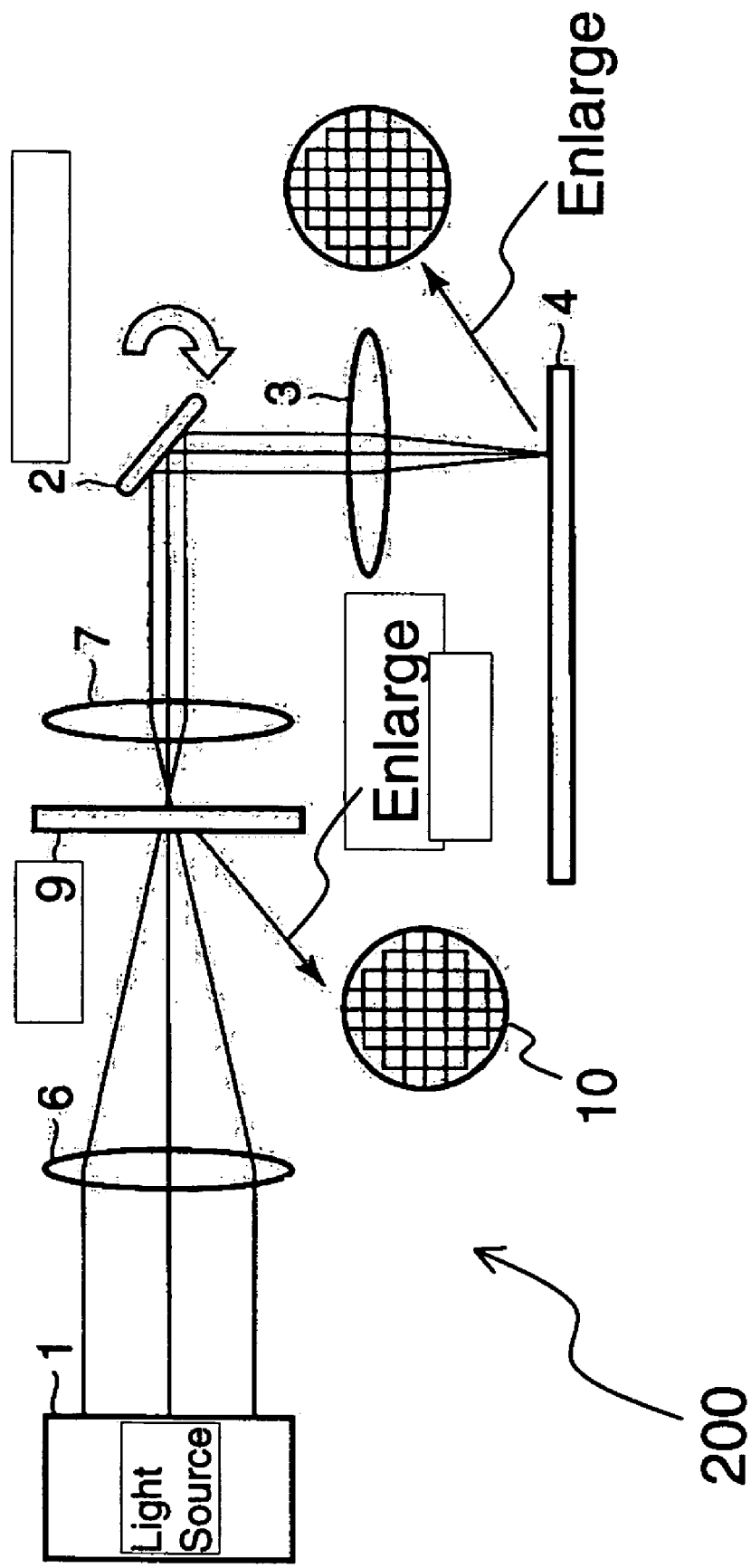
FIG. 3 is a schematic diagram of an exemplary laser marking apparatus consistent with the invention.

A second exemplary embodiment consistent with the present invention is shown in FIG. 3. A mask 9 having a diffraction grating, represented by the enlarge circle 10 in FIG. 3, is arranged between imaging lens 6 and focus lens 7. A laser beam passing through mask 9 has a spatial intensity distribution. As is known, other optical elements may be used to produce a spatial intensity distribution, instead of mask 9. In one embodiment, the pitch of the diffraction grating of mask 9 may be less than 1 µm. In another embodiment, the pitch may be over or equal to 1 µm.

In the embodiment shown in FIG. 3, an intensity distribution corresponding to the diffraction grating of mask 9 is generated on a surface of semiconductor wafer 4 so that a mark with good visibility may be made.

Figure 4:
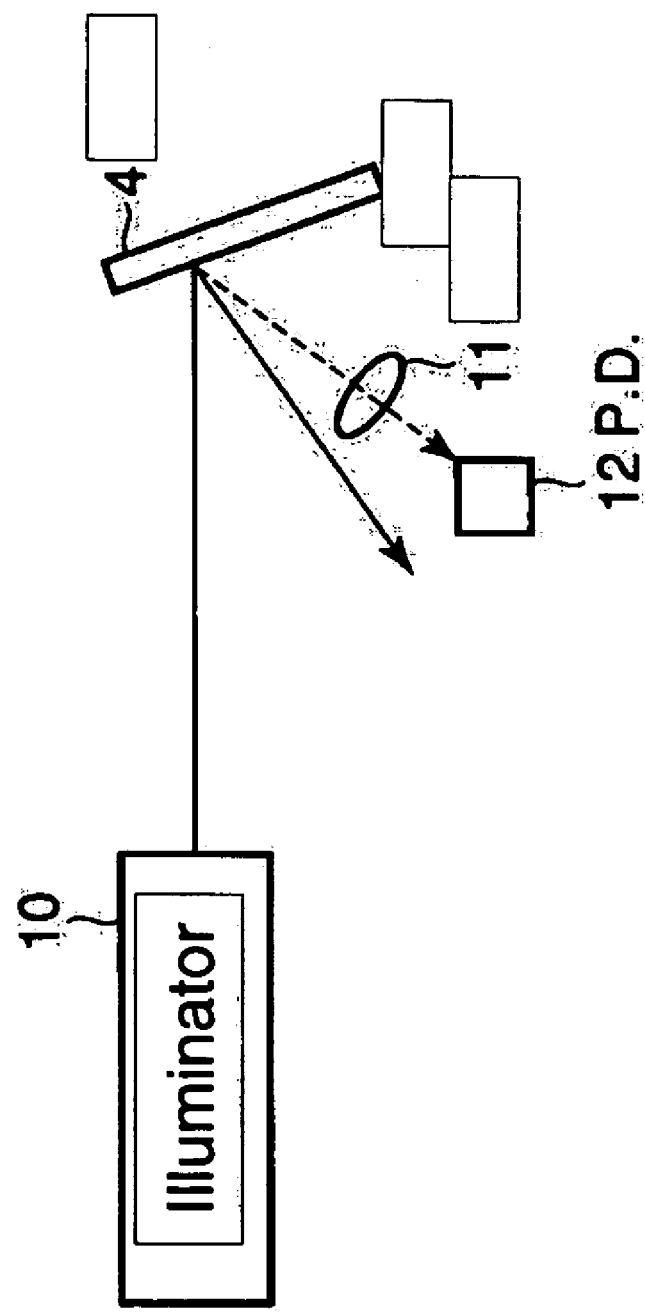
FIG. 4 shows an exemplary apparatus to detect a mark formed on subject consistent with the invention.
Figure 5:
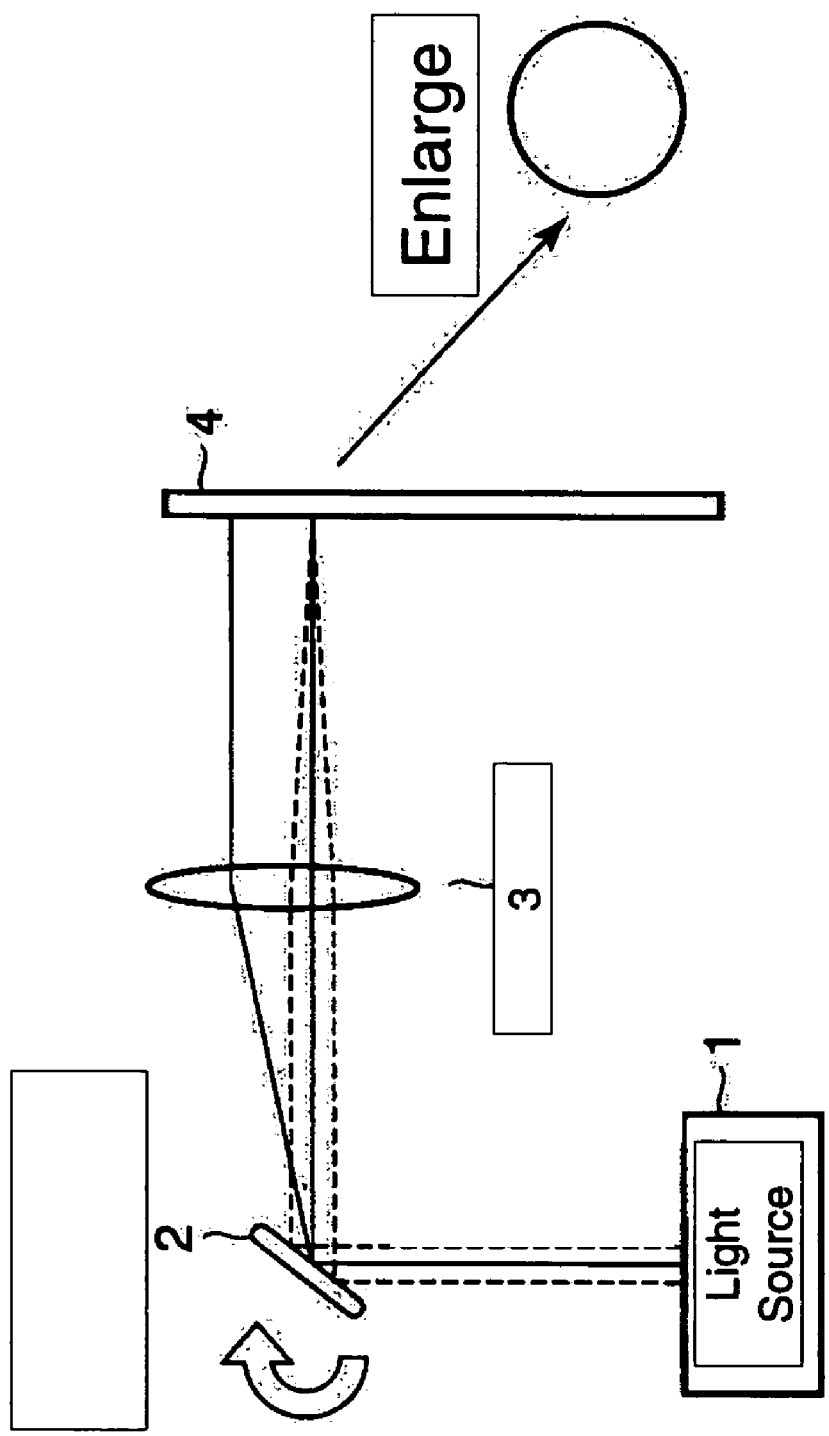
FIG. 5 shows a conventional laser marking apparatus.

FIG. 4 shows a mark reading apparatus to detect a mark, such as a mark made by apparatuses 100 or 200 shown in the first and second exemplary embodiments. As shown an illuminator 10, such as a He—Ne laser light source, emits a light beam toward an area of semiconductor wafer 4 to irradiate a mark. Scattered light from the mark is detected by a photo detector 12 via a focus lens 11.

In summary, the first exemplary embodiment shows a method and apparatus for laser marking where interference fringes are generated in an area of a subject to be machined or marked, such as a semiconductor wafer by binding or merging and superposing multiple laser fluxes. A mark is made according to an intensity distribution corresponding to the interference fringes.

The second exemplary embodiment shows a method and apparatus for laser marking where interference fringes are generated in an area of a subject to be machined or marked, such as a semiconductor wafer, by using a mask having a diffraction grating.

Numerous modifications of the present invention are possible in light of the above teachings. It is therefore to be understood that, within the scope of the appended claims, the present invention can be practiced in a manner other than as specifically described herein. For example, another subject to be machined or marked may be used instead of semiconductor wafer 4. For instance, any product which needs to be identified, such as a cell phone, a dial window of a cell phone, a so-called flash memory, a circuit substrate of a digital camera or the like may be used.

What is claimed is:

1. A method of laser marking, comprising:
   forming an interference fringe by superposing laser fluxes on a subject to be marked using a laser beam; and
   drawing a mark on the subject by moving a spot of the interference fringe on the subject,
   wherein forming the interference fringe includes emitting the laser beam, and dividing the laser beam into laser fluxes, and
   wherein dividing the laser beam includes letting the laser beam pass through a fly-eye lens having convex lenses arranged at equal spaces on a concentric circumference.

2. A method of laser marking according to claim 1, wherein the laser beam passes through a mask having a diffraction grating.

3. A method of laser marking according to claim 1, wherein the subject comprises a semiconductor wafer.

* * * * *